March 6, 1951 I. H. PAGE 2,543,797

RADIO AMPLIFIER CIRCUITS

Filed May 23, 1942

Inventor

Irving H. Page

By [signature]

Attorney

Patented Mar. 6, 1951 2,543,797

UNITED STATES PATENT OFFICE 2,543,797

RADIO AMPLIFIER CIRCUITS

Irving H. Page, Silver Spring, Md.

Application May 23, 1942, Serial No. 444,282

4 Claims. (Cl. 178—44)

Figure 1:
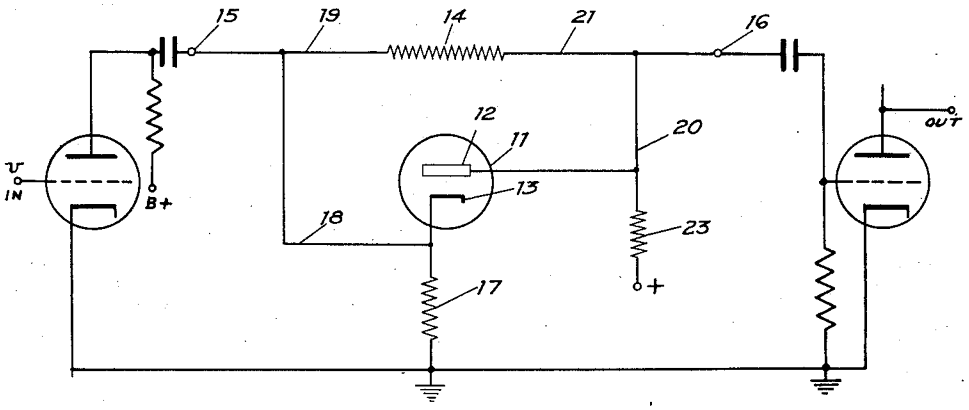

(Granted under the act of March 3, 1883, as amended April 30, 1928; 370 O. G. 757)

This invention relates broadly to radio amplifier circuits and more specifically to improved coupling means for radio amplifier circuits.

In the design of radio receivers it is necessary to not only take into consideration the desired gain and the desired frequency response, but also the operating conditions under which the radio receiver will be employed. In some radio applications, radio receivers are operated in close proximity to radio transmitters which generate pulses of radio frequency at periodic or aperiodic intervals, between which it is necessary that the receiver be capable of detecting signals of extremely low magnitude compared to the magnitude of the signals generated by the transmitter closely associated therewith. In such applications it is necessary to so design the receivers and particularly the coupling circuits between stages of the receivers not only to obtain the desired amplification of weak signals but also to obtain a minimum of saturation from strong signals originating in the nearby transmitter. This is particularly true under those conditions such as in echo ranging where a transmitted pulse of very large amplitude and of approximately 1 to 5 microseconds in duration is repeated at intervals of 100 or more microseconds, and where very weak signals must be detected and amplified by the receiver during the off-period of the transmitter and within a very few microseconds of the on-period of the transmitter.

Additionally, it is frequently desirable to so design radio receiver circuits that the desired weak signals will be amplified with the desired gain and frequency response, while strong interfering signals are by-passed in such a manner as to result in minimum amplification thereof.

Accordingly, it is an object of this invention to provide improved coupling means between stages of radio amplifier receivers.

Another object of this invention is to provide circuits which prevent over-driving of amplifier stages while giving exponential outputs from radio amplifiers.

Still another object of this invention is to provide circuits which permit amplification of desired weak signals while preventing proportionate amplification of strong interfering signals.

It is a further object of this invention to provide coupling circuits for radio amplifier receivers wherein saturating signals are blocked, while desired signals are amplified with the desired gain and frequency response.

A further object of this invention is to provide radio amplifier coupling circuits applicable to positive and/or negative pulses.

Still another object of this invention is to provide radio amplifier coupling circuits functioning as band-pass filters.

Another object of this invention is to provide coupling circuits for radio amplifiers which may be used with any conventional type of coupling between stages of a radio receiver.

Figure 2:
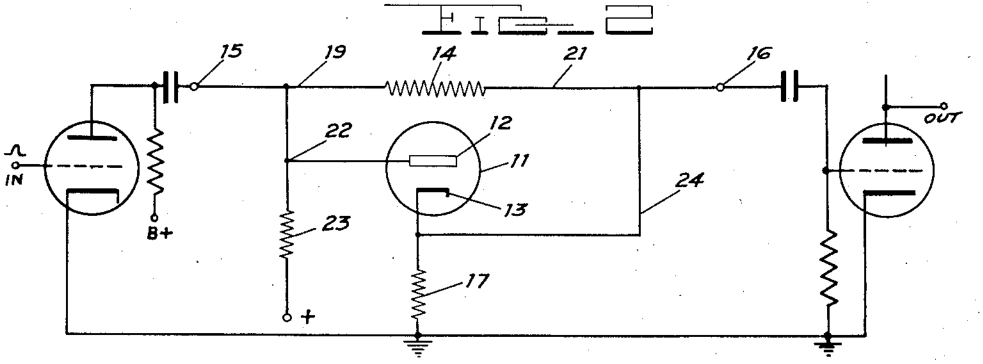
Figure 3:
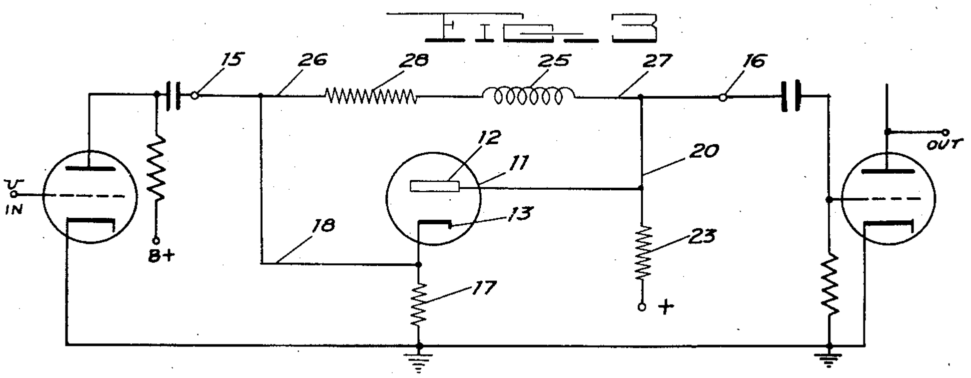

Other objects of this invention will be apparent to those skilled in the art from a careful consideration of the following description when taken together with the accompanying drawings, in which:

Fig. 1 diagrammatically illustrates one particular embodiment of this invention;

Fig. 2 illustrates diagrammatically another embodiment of the invention herein described; and Fig. 3 illustrates diagrammatically a modification of the embodiment of this invention shown in Fig. 1.

Where a strong signal is received in the initial stages of a radio receiver and the outputs of these early stages are coupled to amplifier stages, the strong signal frequently blocks the amplifier stages by saturating the circuit elements thereof with electrical energy. For reception of weak signals it is necessary to utilize circuit elements which become saturated readily when strong signals are received. The provision, between stages of a radio receiver, of coupling circuits which would permit the passage through the receiver of the desired received signals while blocking the passage therethrough of undesired signals of large magnitude, would be advantageous in that it would minimize or prevent blocking in the radio receiver.

It has now been found that the provision of certain circuit elements offering a low impedance to the desired weak signals and offering a high impedance to strong interfering signals may be effectively utilized in coupling the stages of a radio receiver. In general, this may be effected by utilizing an electron tube and a resistance in parallel therewith in such a manner that the electron tube offers low impedance to the desired signals, and offers a much higher impedance to strong signals. The resultant flow of strong signals through the resistance decreases the strong signals to an intensity of such magnitude as to pass through the amplifier stage without saturation thereof.

Referring now with particularity to the drawings in which like reference numerals are used to designate like elements, reference numeral 11 designates an electron tube functioning as a diode, and having an anode 12 and a cathode 13. This electron tube may, of course, be a multi-element tube in which elements other than the anode and the cathode are not utilized or are connected in parallel with either the anode or cathode. A double diode may likewise be used, the anodes and the cathodes respectively being connected in parallel. The reference numeral 14 designates a resistor in parallel with the electron tube 11. The reference numeral 15 indicates an input terminal, and the reference numeral 16 indicates an output terminal; however, where the elements herein described are incorporated directly into a receiver circuit, these terminals of course need not be included. The cathode 13 of the electron tube 11 is connected to ground through the resistor 17 in the conventional manner.

In Fig. 1, designed for the coupling of stages of a receiver for amplification of positive pulse signals, the incoming positive signal received at terminal 15 is applied to cathode 13 of electron tube 11 through lead 18 and to resistor 14 through lead 19. If this signal is a relatively weak signal, the electron tube 11 having a current flowing from anode 12 to cathode 13, offers a relatively low impedance and the incoming signal modifies the current flowing through the tube. Current variation on the anode 12 is reflected at the output terminal 16 through lead 20. However, if the incoming signal is an extremely strong positive signal, the current resulting from the application of voltage to the anode 12 through the resistor 23 and flowing between the anode 12 and the cathode 13 of the electron tube 11 is cut to zero and the electron tube 11 then offers an impedance of infinite value to the incoming signal. The strong signal therefore flows from the incoming terminal 15 through lead 19, resistor 14, and lead 21 to the output terminal 16. Resistance 14 is in series with the electron tube anode of the preceding stage and the electron tube grid of the amplifier stage, and the value of the resistance 14 is such that the full plate swing of the tube voltage of the preceding stage is cut to the exact grid bias desired to be applied on the grid of the amplifying tube through terminal 16. In this manner, strong signals are prevented from driving the grid of the amplifier tube sufficiently positive to result in blocking.

It will thus be seen that the combination of the electron tube 11 and the resistor 14 results in preventing blocking, while at the same time provides exponential amplification of incoming signals.

Referring now with particularity to Fig. 2, there is shown a circuit which may be employed for coupling radio amplifier stages when the signal sought to be amplified consists of a negative pulse. This embodiment of the invention differs from that shown in Fig. 1 primarily in the connections of the anode 12 and cathode 13 of the electron tube 11 to the remaining elements of the circuit. The incoming negative pulse signal received at terminal 15 is applied to the anode 12 of the electron tube 11 through the lead 22. A positive voltage is applied to the anode 12 through the resistor 23, thus resulting in a flow of current from anode 12 to cathode 13. This flow of current offers only a small impedance to an incoming weak signal with the result that the signal flows to the cathode 13 and through the lead 24 to the output terminal 16. However, where a strong negative signal is received at the terminal 15, the polarity of the anode 12 swings negative and the electron tube 11 therefore offers high impedance to the strong signal. The signal therefore flows through lead 19, resistor 14, and lead 21 to output terminal 16. The value of the resistor 14 is chosen to deliver to output terminal 16 only the voltage equal to the desired grid bias on the electron tube of the amplifier stage.

It will therefore be apparent that through utilization of the circuit illustrated in Fig. 2 only low impedance is offered to desired weak negative signals, while a high impedance is offered to blocking or interfering signals, thus preventing saturation of the radio amplifier stages following the improved coupling circuit thus described.

In Fig. 3 there is illustrated a coupling circuit for positive signals, similar to that shown in Fig. 1 except that an inductance 25 and a resistor 28 is substituted for the resistor 14 of Fig. 1. Here, as in Fig. 1, the received positive signal is fed to the cathode 13 of the electron tube 11 and, if not of excessive intensity, bows to the anode 12 and through the lead 20 to the output terminal 16. However, if the incoming signal is a high voltage signal, the current flow through electron tube 11 is reduced to zero and the signal must then flow through lead 26, resistor 28, inductance 25 and lead 27 to the output terminal 16. It will be appreciated that the use of resistor 28 and inductance 25 will offer a maximum impedance only for a given frequency, depending upon the characteristics of the inductance. This circuit therefore serves as a band-pass filter for a given frequency and is effective only against blocking signals of the frequency governed by the characteristics of the inductance 25.

In some applications, where an inductance is employed, as described in connection with Fig. 3, it has been found advantageous to utilize an additional inductance (not shown) in the grid return of the amplifier electron tube to improve the band-pass filter characteristics of the circuit.

The foregoing coupling circuits may be coupled to the preceding stage in any conventional manner, depending upon the specific utilization to which the circuits are being placed. Direct coupling, resistance-capacitance coupling, impedance-capacitance coupling and transformer coupling may all be used, as desired.

Other applications of the combination of circuit elements herein described will be apparent to those skilled in the art from the foregoing disclosure. For example, combinations of several electron tubes and several resistances and/or inductances may be utilized to present a non-blocking coupling circuit for various types of incoming signals.

In a specific application of the foregoing disclosure, the circuit of Fig. 1 can be utilized to couple the positive video output of a 6L6 electron tube into a 6AG7 electron tube. Strong positive pulse signals from the 6L6 electron tube will result in the 6AG7 electron tube taking grid current with resultant blocking of the radio amplifier stages. By the use of a type 6H6 double diode tube as the electron tube 11 in the circuit shown in Fig. 1, with a diode current of 1 milliampere, and by the use of a 200,000-ohm resistor for the resistor indicated by reference numeral 14, the coupling circuit of Fig. 1 furnishes an impedance of approximately 2,000 ohms with no signal applied thereto. As the signal level increases, the cathode of the diode tube swings in a positive direction, thus resulting in a decrease in diode current and an increase in the coupling impedance offered by the electron tube. When the driving signal is high enough to over-drive the amplifier stage following the coupling circuit, the impedance of the diode is infinite due to there being zero voltage between the plate and the cathode of the tube, and therefore the incoming signal cannot flow through the tube to the output terminal 16. The shunt resistor 14, having a resistance of 200,000 ohms, serves to decrease the full plate voltage swing of the preceding tube exactly to the grid bias voltage of the 6AG7 amplifier tube. Because the maximum possible signal voltage is insufficient to drive the grid of the 6AG7 into a positive region, blocking is prevented and exponential amplification of the incoming signal is obtained.

The coupling circuits herein described may be utilized not only to prevent blocking by incoming strong signals, but also in a number of other applications. For example, such circuits may be used in automatic volume control circuits, since the impedance offered to incoming signals varies with the intensity of these signals. The described circuits may also be used in combination with other elements as may be desired.

For purposes of defining terms used in the claims, the statement that two or more elements are in "series circuit relation" means that a portion of the current from a given source of energy flowing through one of the elements also flows through the other circuit element or elements. Also, the term "unby-passed impedance" means that there are no paths in parallel with the impedance which presents substantially no impedance to the signal as would be the case if an appreciable capacitance shunted the impedance.

While specific embodiments and detailed description thereof have been set forth hereinabove, it is to be expressly understood that these have been illustrative only, and that the scope of this invention is not to be limited thereby beyond the scope of the subjoined claims.

The invention described herein may be manufactured and used by or for the Government of the United States of America for governmental purposes without the payment of any royalties thereon or therefor.

I claim:

1. An attenuator circuit as described for substantially reducing the amplitude of a signal voltage having a large amplitude of a given polarity, said attenuator circuit consisting solely of a rectifying means having two electrodes offering a high impedance to current flow in one direction and a low impedance to current flow in the other direction, a first impedance element, a source of direct current voltage, a second impedance element, said first and second impedance elements offering an appreciable impedance to said signal voltage, all of said aforementioned components being in series circuit relation with each other in the order first named and forming a closed path for the flow of direct current therein, said rectifying means being connected in said series circuit to conduct direct current between said electrodes in the low impedance direction thereof in the absence of any signal input to the said series circuit, means coupled to one of said impedance elements for coupling said signal voltage into said series circuit so as to oppose the direct current voltage applied across said rectifying means from said source of direct current voltage, load coupling means coupled to the other of said impedance means for coupling the signal voltage appearing thereacross to an output load device, a third impedance element offering a substantial impedance to said signal voltage coupled across the electrodes of said rectifying means in series circuit relation with said load coupling means relative to said signal voltage.

2. An attenuator circuit for attenuating high amplitude signals of a given polarity comprising an input circuit, an output circuit, said input and output circuits offering an appreciable impedance to said signals, a rectifying means having two electrodes offering a high impedance to current flow in one direction and a low impedance to current flow in the other direction, a source of direct current voltage, said input and output circuits and said other aforementioned components being in series circuit relation with each other and forming a closed path for the flow of direct current therein, said rectifying means being connected to conduct direct current between said electrodes in the low impedance direction thereof in the absence of any signal input to said series circuit, means coupling a source of signal voltage to said input circuit so that signals of said given polarity will oppose the direct current voltage applied across said rectifying means from said source of direct current voltage, load coupling means coupled to said output circuit for coupling the signal appearing therein to a load device, an impedance element offering a substantial impedance to said signal voltage coupled across the electrodes of said rectifying means in series circuit relation with said output circuit relative to said source of signal voltage.

3. In combination, a signal voltage source having high amplitude signals of a given polarity to be attenuated, a load device therefore, and only a single signal path coupling said signal source to said load device, said signal path comprising an input circuit, an output circuit, said input and output circuits offering an appreciable impedance to said signal voltage, a rectifying means having two electrodes offering a high impedance to current flow in one direction and a low impedance to current flow in the other direction, a source of direct current voltage, said input and output circuits, said rectifying means, and said source of direct current voltage being in series circuit relation with each other and forming a closed path for the flow of direct current therein, said rectifying means being connected to conduct direct current between said electrodes in the low impedance direction thereof in the absence of any signal input to said series circuit, means coupling said signal voltage source to said input circuit so that signals of said given polarity will oppose the direct current voltage applied across said rectifying means from said source of direct current voltage, load coupling means coupled to said output circuit for coupling the signal appearing therein to said load device, an impedance element offering a substantial impedance to said signal voltage coupled across the electrodes of said rectifying means in series circuit relation with said output circuit relative to said source of signal voltage.

4. An attenuator circuit for substantially reducing the amplitude of a signal voltage having a large amplitude of a given polarity comprising a rectifying means having two electrodes offering a high impedance to current flow in one direction and a low impedance to current flow in the other direction, a first unby-passed impedance element, a source of direct current voltage, a second unby-passed impedance element, said first and second impedance elements offering an appreciable impedance to said signal voltage, all of said aforementioned components being in series circuit relation with each other in the order first named and forming a closed path for the flow of direct current therein, said rectifying means being connected to conduct direct current between said electrodes in the low impedance direction thereof in the absence of any signal input to the said series circuit, means coupled to one of said impedance elements for coupling said signal voltage into said series circuit so as to oppose the direct current voltage applied across said rectifying means from said source of direct current voltage, load coupling means coupled to the other of said impedance means for coupling the signal voltage appearing thereacross to an output load device, a third unby-passed impedance element offering a substantial impedance to said signal voltage coupled across the electrodes of said rectifying means in series circuit relation with said load coupling means relative to said signal voltage.

IRVING H. PAGE.

REFERENCES CITED

The following references are of record in the file of this patent:

UNITED STATES PATENTS

| Number | Name | Date |
|---|---|---|
| 1,466,841 | Levy | Sept. 4, 1923 |
| 2,173,497 | Schlesinger | Sept. 19, 1939 |
| 2,181,309 | Andrieu | Nov. 28, 1939 |
| 2,248,267 | Bacon | July 8, 1941 |
| 2,258,762 | Hickok | Oct. 14, 1941 |
| 2,259,532 | Nicholson | Oct. 21, 1941 |
| 2,259,538 | Wheeler | Oct. 21, 1941 |